(12) United States Patent
Huang et al.

(10) Patent No.: US 7,813,466 B2
(45) Date of Patent: Oct. 12, 2010

(54) JITTER-FREE DIVIDER

(75) Inventors: Yu Huang, San Diego, CA (US); Wei Fu, San Diego, CA (US)

(73) Assignee: Applied Micro Circuit Corporation, San Diego, CA (US)

(*) Notice: Subject to any disclaimer, the term of this patent is extended or adjusted under 35 U.S.C. 154(b) by 29 days.

(21) Appl. No.: 12/405,905

(22) Filed: Mar. 17, 2009

(65) Prior Publication Data

US 2009/0167374 A1 Jul. 2, 2009

Related U.S. Application Data

(63) Continuation-in-part of application No. 11/717,262, filed on Mar. 13, 2007.

(51) Int. Cl.
*H03K 21/00* (2006.01)

(52) U.S. Cl. .......................................... 377/47; 377/48

(58) Field of Classification Search .................. None
See application file for complete search history.

(56) References Cited

U.S. PATENT DOCUMENTS

| | | | |
|---|---|---|---|
| 5,510,742 A * | 4/1996 | Lemaire | 327/146 |
| 6,157,694 A * | 12/2000 | Larsson | 377/48 |
| 6,542,013 B1 * | 4/2003 | Volk et al. | 327/115 |
| 6,583,674 B2 * | 6/2003 | Melava et al. | 331/16 |
| 6,671,341 B1 * | 12/2003 | Kinget et al. | 375/373 |
| 7,035,367 B2 * | 4/2006 | Melava | 375/376 |
| 7,486,145 B2 * | 2/2009 | Floyd et al. | 331/1 A |
| 7,560,962 B2 * | 7/2009 | Kamath | 327/158 |
| 2003/0068003 A1 * | 4/2003 | Casagrande | 377/47 |
| 2008/0094113 A1 * | 4/2008 | Kuan | 327/117 |
| 2008/0164917 A1 * | 7/2008 | Floyd et al. | 327/117 |
| 2009/0296878 A1 * | 12/2009 | Tsai | 377/47 |
| 2009/0302900 A1 * | 12/2009 | Marutani | 327/117 |

* cited by examiner

*Primary Examiner*—Tuan Lam
(74) *Attorney, Agent, or Firm*—Law Office of Gerald Maliszewski; Gerald Maliszewski

(57) ABSTRACT

A system and method are provided for jitter-free fractional division. The method accepts a first plurality of first signal phases, each phase having a first frequency. To make the division jitter-free, a phase is selected subsequent to deselecting a previous phase selection. The selected phase is divided by the integer N, supplying a second signal with a second frequency. Using the second signal as a clock, a first plurality of counts is triggered in series, and the counts are used to select a corresponding phase. The first signal may separate neighboring phases by 90 degrees. Then, for (N+0.25), a first count triggers a second count and selects the first phase, the second count triggers a third count and selects the second phase, the third count triggers a fourth count and selects the third phase, and the fourth count trigger the first count and selects the fourth phase.

12 Claims, 11 Drawing Sheets

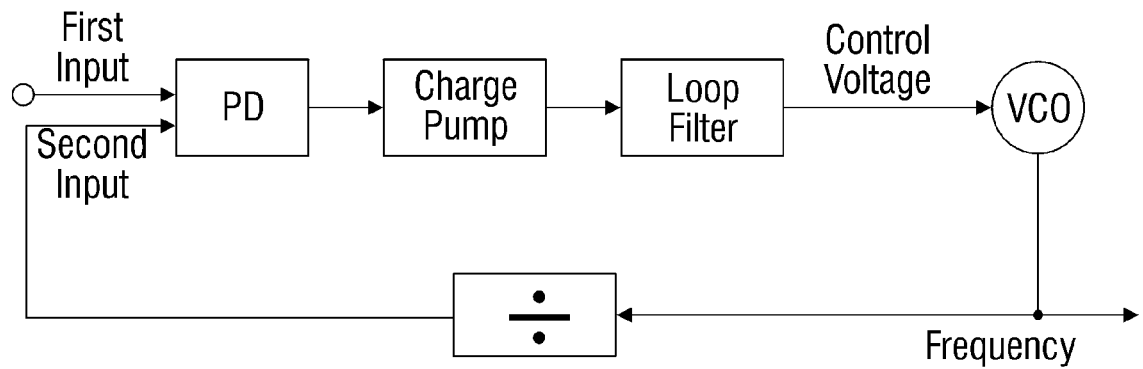
FIG. 1
(Prior Art)
Input Clock
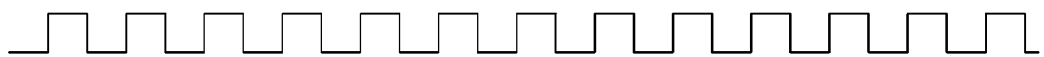
Output Clock
(Fractionally
divided by 2.25)
FIG. 2
(Prior Art)

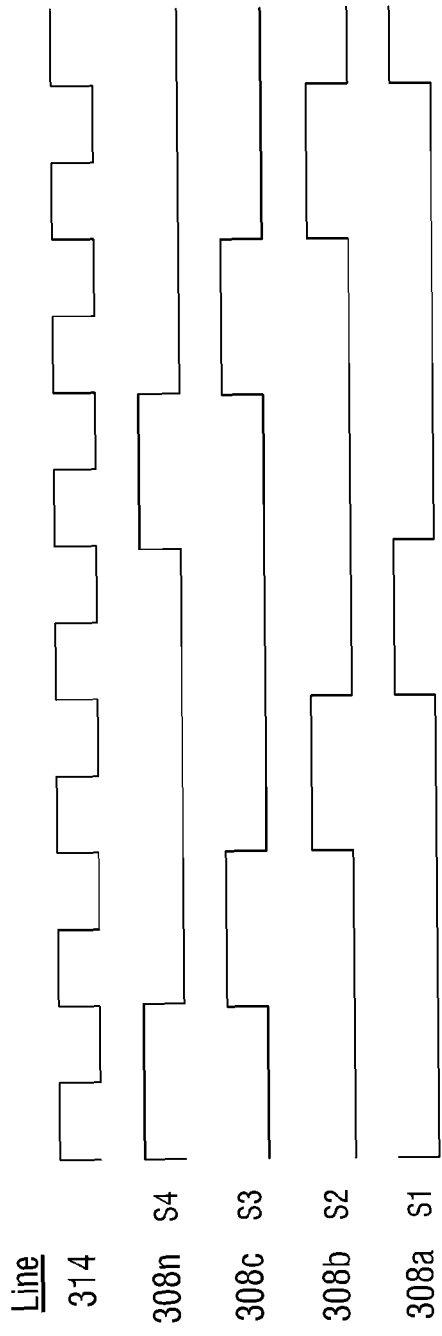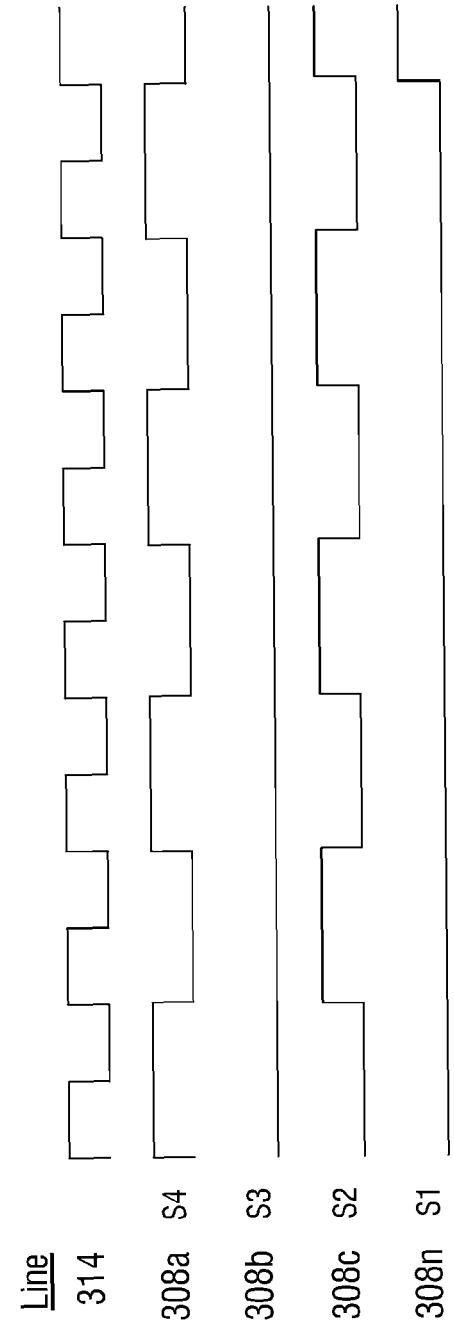

US 7,813,466 B2

JITTER-FREE DIVIDER

RELATED APPLICATIONS

This application is a continuation-in-part of a pending application entitled, HIGH SPEED MULTI-MODULUS PRESCALAR DIVIDER, invented by An et al., Ser. No. 11/717,262, filed Mar. 13, 2007, which is incorporated herein by reference.

BACKGROUND OF THE INVENTION

1. Field of the Invention

This invention generally relates to electronic circuitry and, more particularly, to a system and method for deterministic jitter-free fractional division.

2. Description of the Related Art

FIG. 1 is a schematic block diagram of a conventional phase locked loop (prior art). A phase detector (or frequency detector) receives a first input signal, such as might be supplied on a serial data stream or a clock source, and compares it to a second input signal supplied by the divider. The phase detector (PD) generates an output that is responsive to difference in timing between the two input signals. A charge-pump may be added to improve the response of the PLL, as the phase detector output does not necessarily have enough drive to instantaneously charge (or discharge) the loop filter reactances. The loop filter is typically a low-pass filter, and is used to control the overall loop response. The voltage controlled oscillator (VCO) supplies an output frequency that is responsive to the input voltage level. The loop is locked when the phase detector inputs match. The divider is typically inserted in the path between the VCO and the phase detector. The divider has two primary functions. The divider permits the phase detector to be operated at a lower frequency. Also, the divider acts as a relatively simple means of controlling the VCO output frequency.

The VCO can be controlled to supply a number of different frequencies by manipulating the division ratio. This task is relatively simple if the divider is a hardware device designed to divide the VCO frequency by a range of selectable integer numbers. "Pulse-swallowing" is one technique that can be used to obtain a desired division ratio. Pulse-swallowing also permits non-integer and odd-inter ratios to be obtained. For example, a divisor of 3 may be obtained if the VCO frequency is alternately divided by the divisors of 2 and 4. However, the pulse-swallowing technique may generate undesirable harmonic frequencies components and pulse jitter. Further, it may not be possible to conveniently generate every required frequency using just the pulse-swallowing technique.

FIG. 2 is a timing diagram depicting a fractional clock output with jitter (prior art). The period of the output clock is equal to the input clock divided by 2.25. For the (N+0.25) divide ratio where N=2, the divider divides input clock by N(2) for 3 cycles, then divides the input clock by N+1(3) for one cycle. The total divide ratio is ((3×N)+(N+1))/4=N+0.25. The average period, or combination of the output clocks is equal to the input clock/2.25. However, the jitter can be as large as one input clock period. Jitter, as defined herein, is a periodic waveform asymmetry or spurious frequency component associated with an intended frequency. Glitch is defined as a random unintended signal.

FIG. 15 depicts a drawing from pending parent application entitled, HIGH SPEED MULTI-MODULUS PRESCALAR DIVIDER, invented by An et al., Ser. No. 11/717,261, filed Mar. 13, 2007. This application discloses a divider capable of dividing a clock frequency by a integer, without resorting to pulse-swallowing. The divider enables the division process by generating a plurality of clock phase and uses a counter to select clock phases. While the divider is capable of creating each output clock period accurately, the selection of phase inputs by the MUX is not always free of glitches.

It would be advantageous if a divider existed that was able to divide an input clock within a range of selectable values and create a jitter-free output clock.

SUMMARY OF THE INVENTION

A divider is presented that divides an input clock ratio by fractional ratios, such as N+0.75, N+0.5, and N+0.25, dynamically in response to a control signal. By selecting between different phases of an input signal frequency, the input signal can be divided by a (non-fractional) integer (N), while obtaining the results of using a fractional divisor. The divider is able to divide high speed input signals, without jitter while consuming low amounts of power. Therefore, the circuitry has application as a high performance prescalar in fractional-N synthesizers, especially in fractional-N synthesizers with high loop frequencies where low dividing ratios are required.

Accordingly, a method is provided for jitter-free fractional division. The method accepts a first plurality of first signal phases, each phase having a first frequency. To make the division jitter-free, a phase is selected subsequent to deselecting a previous phase selection. The selected phase is divided by the integer N, supplying a second signal with a second frequency. Using the second signal as a clock, a first plurality of counts is triggered in series, and the counts are used to select a corresponding phase.

For example, the first signal may be accepted with 4 phases, where each phase separated from a neighboring phase by 90 degrees. Series triggering the first plurality of counts may including using a first count to trigger a second count, using the second count to trigger a third count, using the third count to trigger a fourth count, and using the fourth count to trigger the first count. Then, using each count to select the corresponding phase may include using the first count to select a first phase (of the first signal), using the second count to select a second phase, using the third count to select a third phase, and using the fourth count to select a fourth phase.

Additional details of the above-described method and a system for jitter-free fractional division are provided below.

BRIEF DESCRIPTION OF THE DRAWINGS

FIG. 1 is a schematic block diagram of a conventional phase locked loop (prior art).

FIG. 2 is a timing diagram depicting a fractional clock output with jitter (prior art).

FIG. 10 is a timing diagram depicting the relationship between the second frequency and the counters for (N+0.75).

FIG. 11 is a timing diagram depicting the relationship between the second frequency and the counters for (N+0.5).

DETAILED DESCRIPTION

Figure 3:
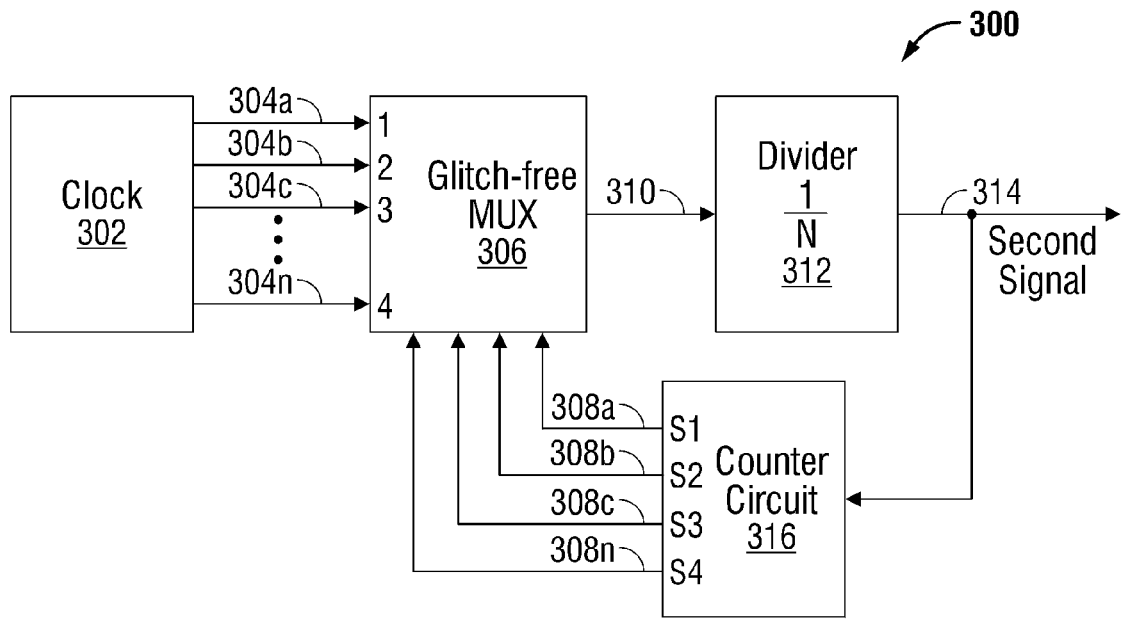
FIG. 3 is a schematic block diagram depicting a system for jitter-free fractional division.

FIG. 3 is a schematic block diagram depicting a system for jitter-free fractional division. The system 300 comprises a clock 302 having an output on line 304 to supply a first plurality of first signal phase signals, each phase signal having a first frequency. Shown are outputs on lines 304a, 304b, 304c, and 304n. In this example the variable n is equal to 4, but the system is not limited to any particular value. In this example the clock 302 supplies a first signal with four phases, each phase separated from a neighboring phase by 90 degrees (see FIG. 8).

A glitch-free multiplexer (MUX) 306 has an input on lines 304a through 304n to accept the first plurality of phase signals, and a control input on line 308 to accept a first plurality of phase selection signals. Shown are control signals on lines 308a through 308n. Typically, the number of control signals is equal to the number of inputs (phases) to the glitch-free MUX 306. The glitch-free MUX 306 has an output on line 310 to supply a selected phase signal subsequent to deselecting a previous phase selection.

A divider 312 has an input on line 310 to accept the selected phase signal. The divider 312 divides the selected phase signal by the integer N, and supplies a second signal with a second frequency at an output on line 314. Note: N is a variable not limited to any particular value. A counter circuit 316 includes a first plurality of serially-connected counters. As described in more detail below, each counter has a clock input to accept the second signal on line 314 and an output to supply a count as an input to a subsequent counter and as a corresponding phase selection signal to the glitch-free MUX on line 308.

Figure 4:
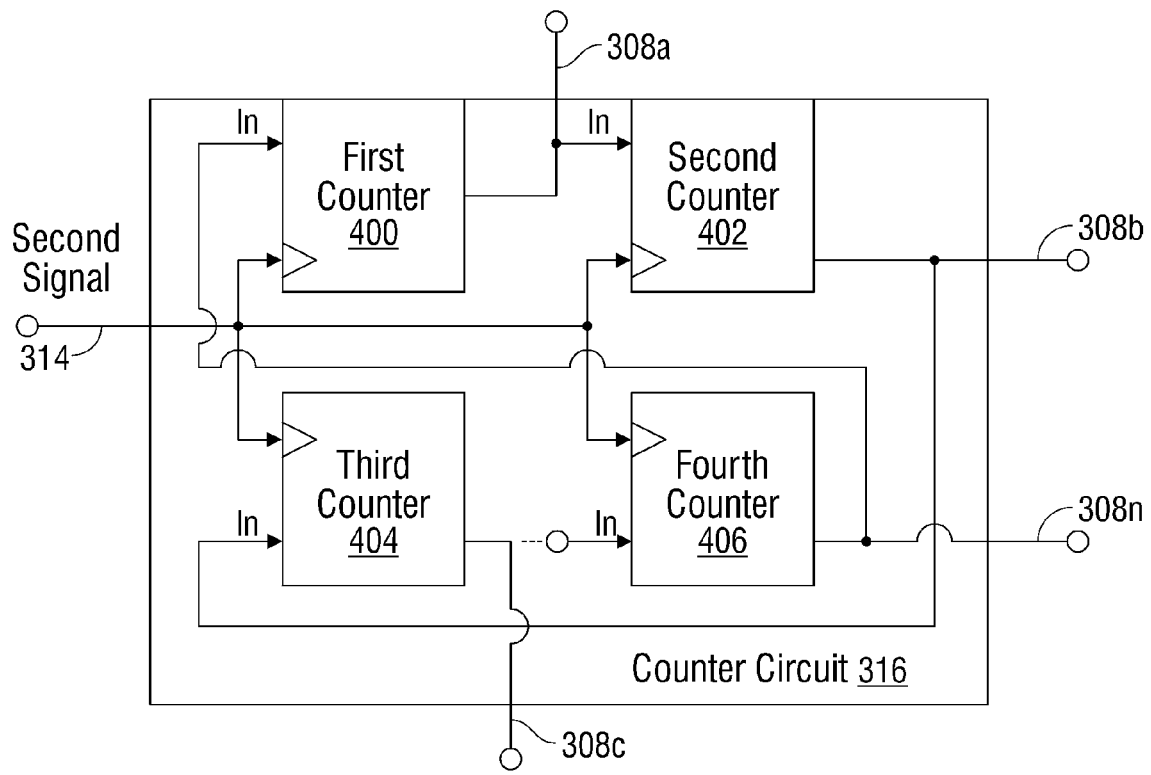
FIG. 4 is a schematic block diagram depicting the counter circuit of FIG. 3 in greater detail.

FIG. 4 is a schematic block diagram depicting the counter circuit 316 of FIG. 3 in greater detail. A first counter 400 has a signal input, a clock input to accept the second signal on line 314, and a first count output on line 308a triggered in response to the combination of signal and clock inputs. A second counter 402 has a signal input, a clock input to accept the second signal on line 314, and a second count output on line 308b triggered in response to the combination of signal and clock inputs.

A third counter 404 has a signal input, a clock input to accept the second signal on line 314, and a third count output on line 308c triggered in response to the combination of signal and clock inputs. A fourth counter 406 has a signal input, a clock input to accept the second signal on line 314, and a fourth count output on line 308n connected to the first counter input, triggered in response to the combination of signal and clock inputs. Typically, the number of counters is equal to the number first signal phases (n).

In this example (n=4), the second frequency may be (first frequency)(N+0.25), (first frequency)(N+0.5), or (first frequency)(N+0.75). If the second frequency=(first frequency)(N+0.25), or (N+0.75), the counters are connected as follows. The first count output on line 308a is connected to the second counter signal input. The second count output on line 308b is connected to the third counter signal input. The third count output on line 308c is connected to the fourth counter signal input, and the fourth count output on line 308n is connected to the first counter signal input.

If the second frequency=(first frequency)(N+0.5), the counters are connected as follows. The first count output on line 308a is connected to the third counter signal input. The third count output on line 308c is connected to the first counter signal input. The second and fourth counts are not used.

Figure 5:
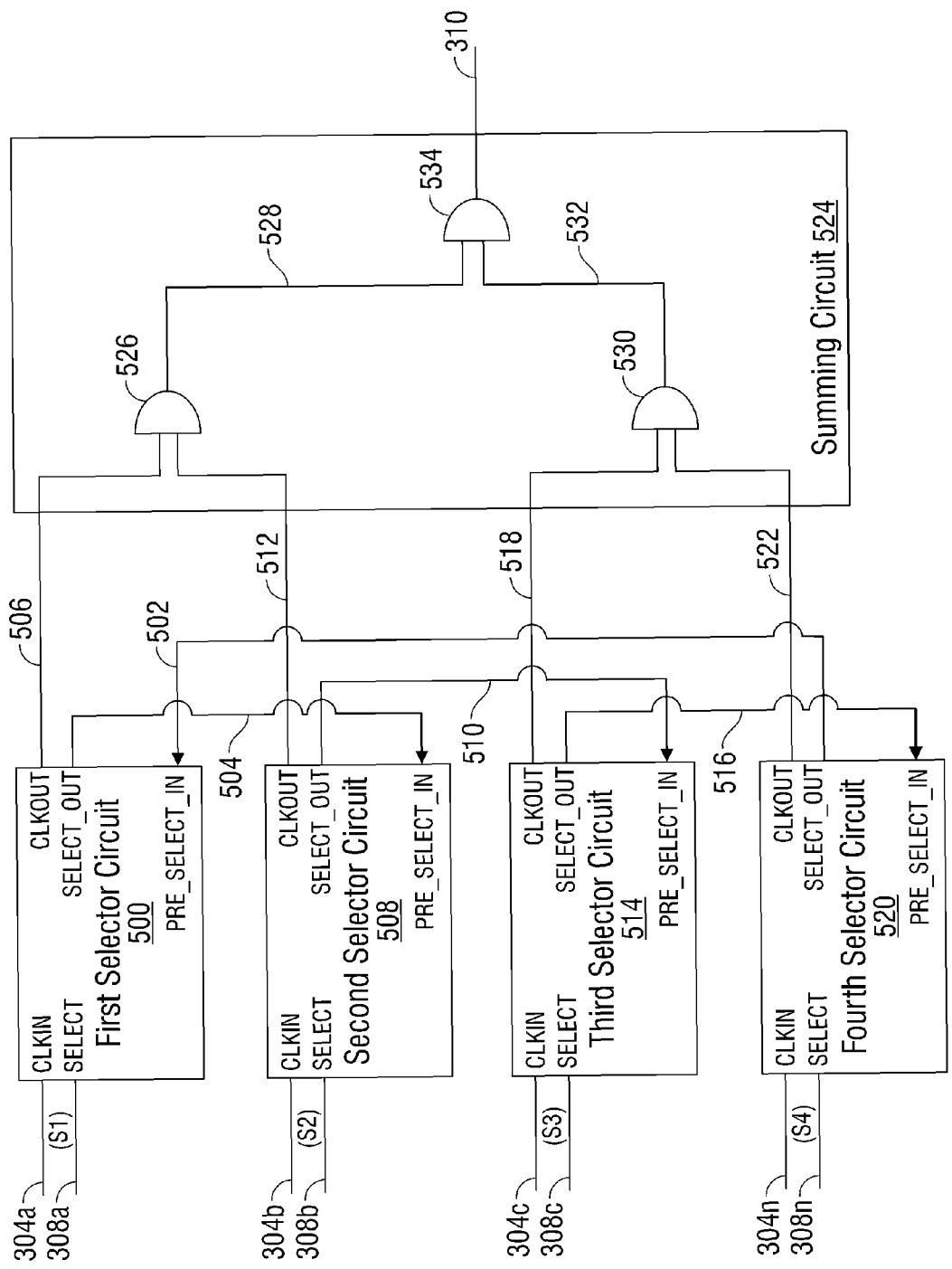
FIG. 5 is a schematic block diagram depicting the glitch-free MUX of FIG. 3 in greater detail, assuming that the second frequency=)first frequency)(N+0.25).

FIG. 5 is a schematic block diagram depicting the glitch-free MUX 306 of FIG. 3 in greater detail. The example of FIG. 5 assumes that the second frequency=(first frequency)(N+0.25). The glitch-free MUX 306 includes a first selector circuit 500 having an input to accept a first phase signal (CLKIN1) on line 304a, an input to accept a first phase selection signal (SELECT1) on line 308a, an input to accept a SELECT_OUT4 signal on line 502, an output to supply a SELECT_OUT1 signal on line 504 in response to a last occurrence of a first phase signal (CLKOUT1), and an output on line 506 to supply the first phase signal in response to accepting the SELECT_OUT4 signal.

A second selector circuit 508 has an input to accept a second phase signal (CLKIN2) on line 304b, an input to accept a second count phase selection signal (SELECT2) on line 308b, an input to accept the SELECT_OUT1 signal (PRE_SELECT_IN2) on line 504, an output to supply a SELECT_OUT2 on line 510 signal in response to the last occurrence of a second phase signal (CLKOUT2), and an output on line 512 to supply the second phase signal in response to accepting the SELECT_OUT1 signal.

A third selector circuit 514 has an input on line 304c to accept a third phase signal (CLKIN3), an input on line 308c to accept a third count phase selection signal (SELECT3), an input on line 510 to accept the SELECT_OUT2 signal (PRE_SELECT_IN3), an output on line 516 to supply a SELECT_OUT3 signal in response to last occurrence of a third phase signal (CLKOUT3), and an output on line 518 to supply the third phase signal in response to accepting the SELECT_OUT2 signal.

A fourth selector circuit 520 has an input on line 304n to accept a fourth phase signal (CLKIN4), an input on line 308n to accept a fourth count phase selection signal (SELECT4), an input on line 516 to accept the SELECT_OUT3 signal (PRE_SELECT_IN4), an output on line 502 to supply the SELECT_OUT4 signal in response to the last occurrence of a fourth phase signal (CLKOUT4), and an output on line 522 to supply the fourth phase signal in response to accepting the SELECT_OUT3 signal.

The first selector circuit 500 ceases to supply the first phase signal on line 506 prior to the second selector circuit 508 beginning to supply the second phase signal on line 512. The second selector circuit 508 ceases to supply the second phase signal on line 512 prior to the third selector circuit 514 beginning to supply the third phase signal on line 518. The third selector circuit 514 ceases to supply the third phase signal prior to the fourth selector circuit 520 beginning to supply the fourth phase signal on line 522. The fourth selector circuit 520 ceases to supply the fourth phase signal prior to the first selector circuit 500 beginning to supply the first phase signal on line 506.

Figure 6:
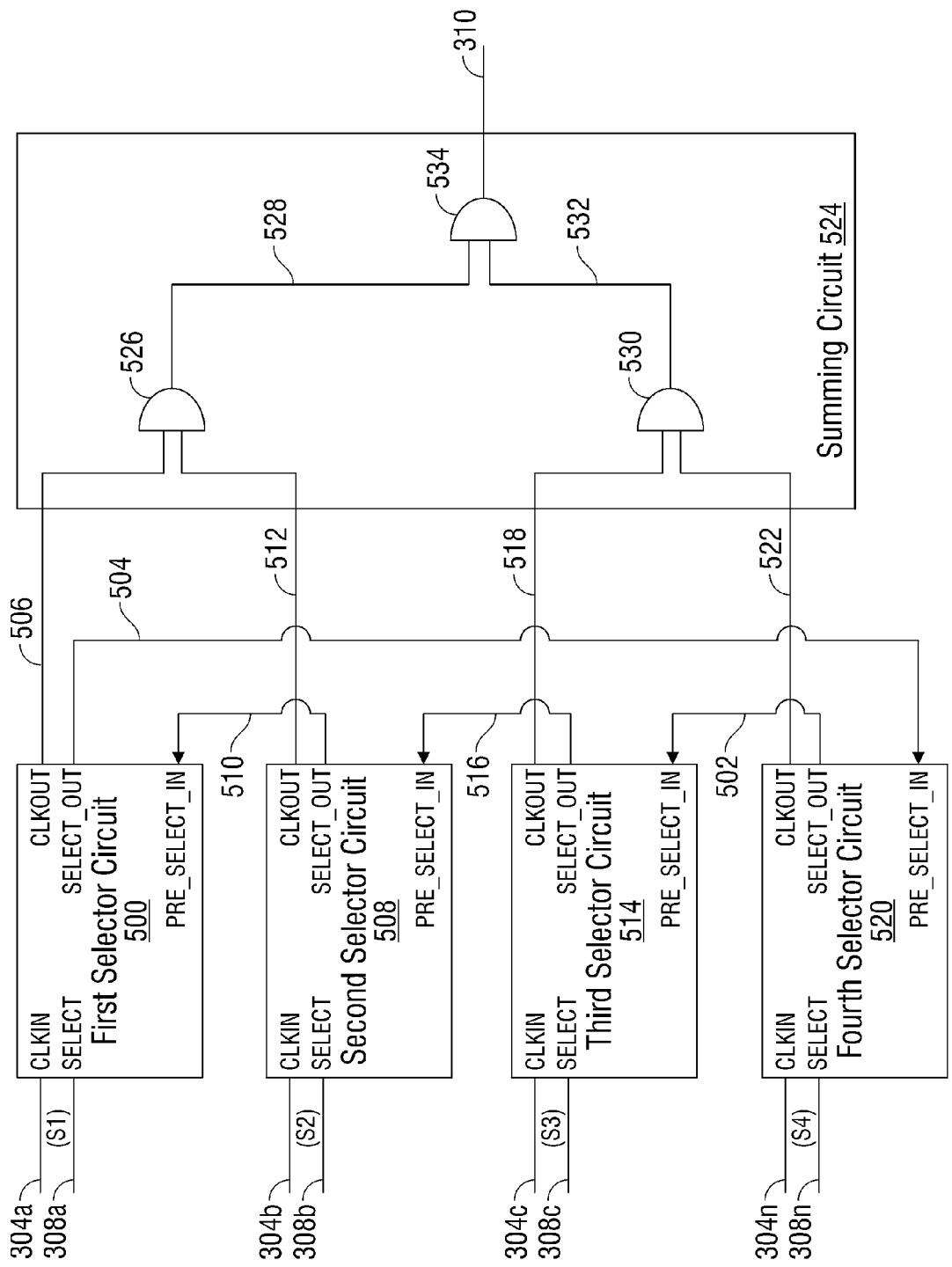
FIG. 6 is a schematic block diagram depicting the glitch-free MUX of FIG. 3, assuming that the second frequency= (first frequency)(N+0.75).

FIG. 6 is a schematic block diagram depicting the glitch-free MUX 306 of FIG. 3, assuming that the second frequency=(first frequency)(N+0.75). The glitch-free MUX of FIG. 6 is that same as the one shown in FIG. 5 except for the interconnections between selector circuits. In this aspect, the first selector circuit 500 has an input to accept a SELECT_OUT2 signal (PRE_SELECT_IN1) on line 510, an output to supply the SELECT_OUT1 signal on line 504 in response to a last occurrence of a first phase signal (CLKOUT1), and an output on line 506 to supply the first phase signal in response to accepting the SELECT_OUT2 signal.

The second selector circuit 508 has an input to accept the SELECT_OUT3 signal (PRE_SELECT_IN2) on line 516, an output to supply a SELECT_OUT2 on line 510 signal in response to the last occurrence of a second phase signal (CLKOUT2), and an output on line 512 to supply the second phase signal in response to accepting the SELECT_OUT3 signal.

The third selector circuit 514 has an input on line 502 to accept the SELECT_OUT4 signal (PRE_SELECT_IN3), an output on line 516 to supply a SELECT_OUT3 signal in response to last occurrence of a third phase signal (CLKOUT3), and an output on line 518 to supply the third phase signal in response to accepting the SELECT_OUT4 signal.

The fourth selector circuit 520 has an input on line 504 to accept the SELECT_OUT1 signal (PRE_SELECT_IN4), an output on line 502 to supply the SELECT_OUT4 signal in response to the last occurrence of a fourth phase signal (CLKOUT4), and an output on line 522 to supply the fourth phase signal in response to accepting the SELECT_OUT1 signal.

The first selector circuit 500 ceases to supply the first phase signal prior to the fourth selector circuit 520 beginning to supply the fourth phase signal. The fourth selector circuit 520 ceases to supply the fourth phase signal prior to the third selector circuit 514 beginning to supply the third phase signal. The third selector circuit 514 ceases to supply the third phase signal prior to the second selector circuit 508 beginning to supply the second phase signal, and the second selector circuit 508 ceases to supply the second phase signal prior to the first selector circuit 500 beginning to supply the first phase signal.

As shown in FIGS. 5 and 6, the system further comprises a summing circuit 524. The summing circuit 524 includes a first NAND gate 526 having inputs on lines 506 and 512 to accept the first and second phase signals, and an output on line 528 to supply a first NAND signal. A second NAND gate 530 has inputs on lines 518 and 522 to accept the third and fourth phase signals and an output on line 532 to supply a second NAND signal. A third NAND gate 534 has inputs on lines 528 and 532 to accept the first and second NAND signals and an output on line 310 to supply the selected phase signal. It should be understood that a practitioner skilled in the art would be able to enable a summing circuit using other designs.

Figure 7:
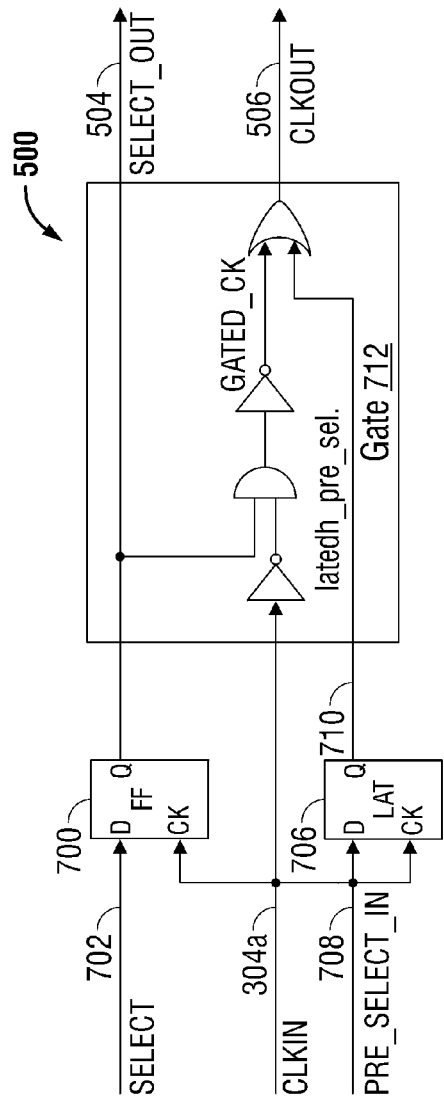
FIG. 7 is a schematic block diagram depicting a selector circuit of FIG. 5 or 6 in greater detail.

FIG. 7 is a schematic block diagram depicting a selector circuit of FIG. 5 or 6 in greater detail. The first selector circuit 500 is used as an example. The internal components of each selector circuit are identical. The first selector circuit 500 includes a flip-flop (FF) 700 having a signal input on line 702 to accept the SELECT signal, a clock input on line 304a to accept a CLKIN signal, and an output on line 504 to supply a SELECT_OUT signal. A latch 706 has an input (PRE_SELECT_IN) on line 708 to accept a SELECT_OUT signal from another selector circuit, a clock input to accept the CLKIN signal on line 304a, and an output to supply a latch signal on line 710.

A gate 712 has an input to accept the SELECT_OUT signal from the FF on line 504, an input to accept the CLKIN signal on line 304a, an input to accept the latch (latedh_pre_sel) signal on line 710, and an output to supply the CLKOUT signal on line 506 in response to the combination of the SELECT_OUT, CLKIN, and latch signals. Note: a practitioner is the art would be able to design alternate configurations of the first selector circuit 500 or the gate 708, and obtain the same functions as the depicted design.

Functional Description

Figure 8:
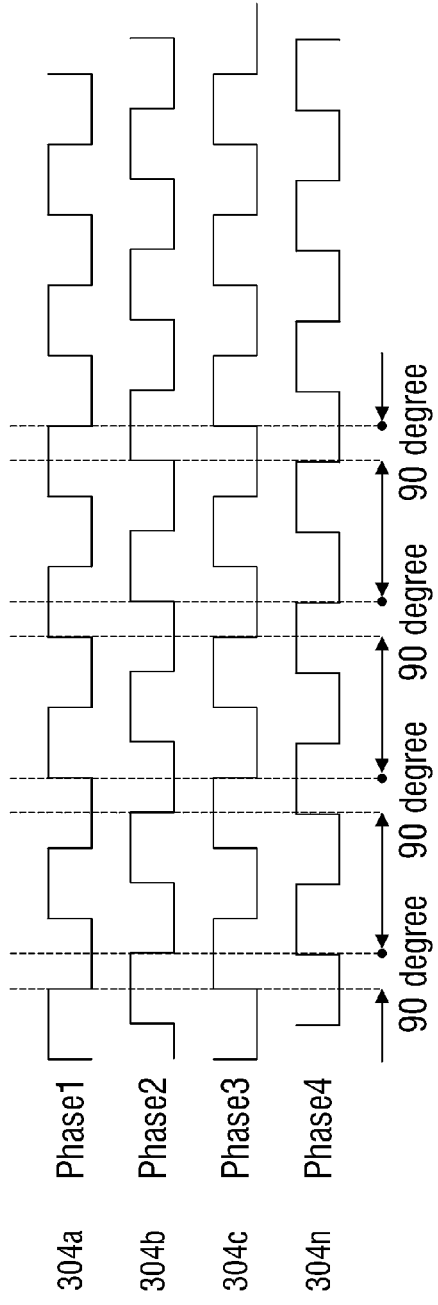
FIG. 8 is a timing diagram depicting an example where the clock outputs a first signal with four phases.

FIG. 8 is a timing diagram depicting an example where the clock outputs a first signal with four phases. The 4 phases may be differential in-phase and differential quadrature clocks.

Figure 9A:
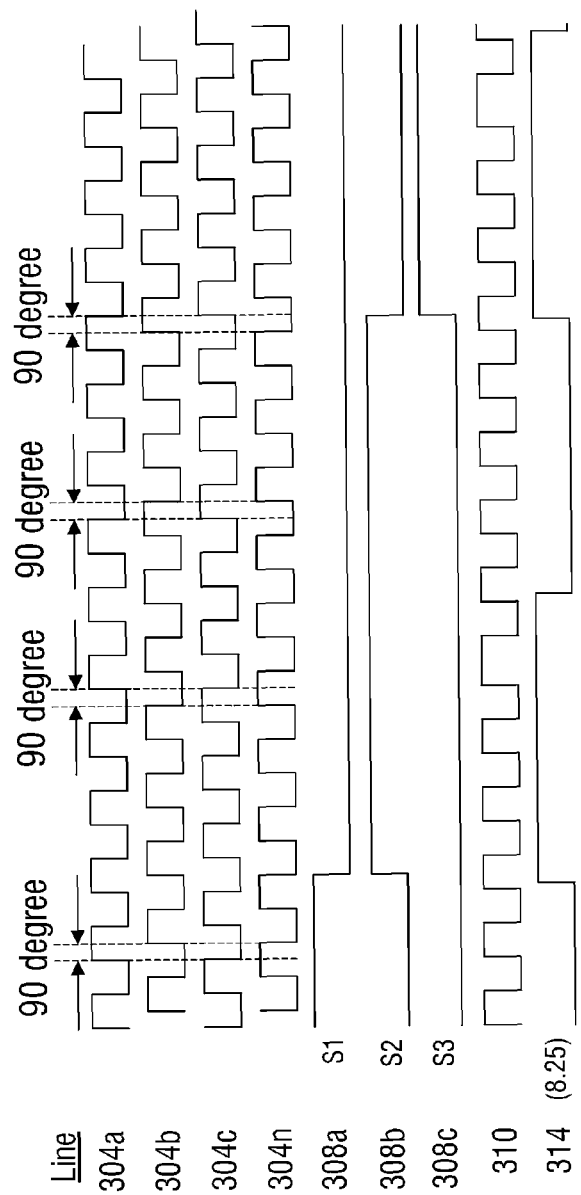
FIGS. 9A and 9B are timing diagrams associated with the glitch-free MUX of FIG. 5, where the second signal frequency=(first frequency)(N+0.25).
Figure 9B:
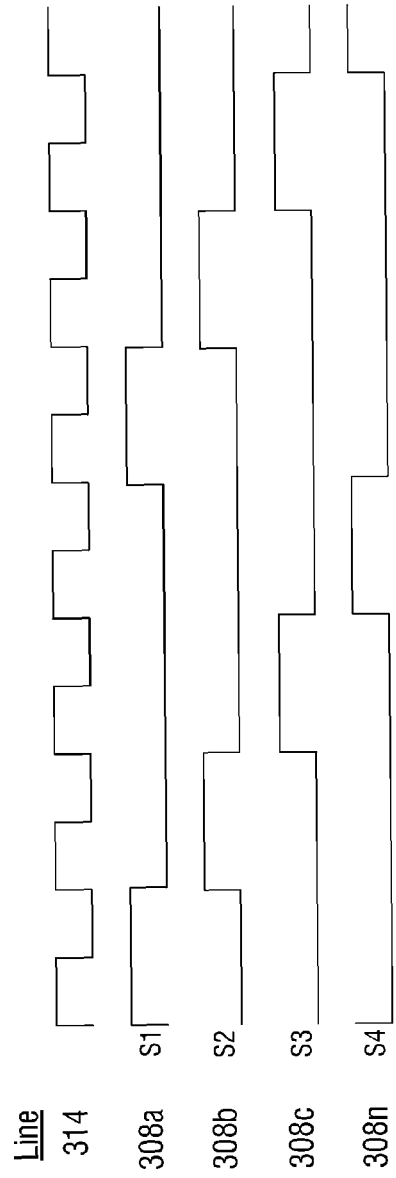

FIGS. 9A and 9B are timing diagrams associated with the glitch-free MUX of FIG. 5, where the second signal frequency=(first frequency)(N+0.25). In this example, N=8. The timing relationships are rescaled in FIG. 9B so that the fourth counter output (S4) 308$n$ can be seen.

FIG. 10 is a timing diagram depicting the relationship between the second frequency and the counters for (N+0.75). In this example, N=8.

FIG. 11 is a timing diagram depicting the relationship between the second frequency and the counters for (N+0.5). In this example, N=8.

Figure 12:
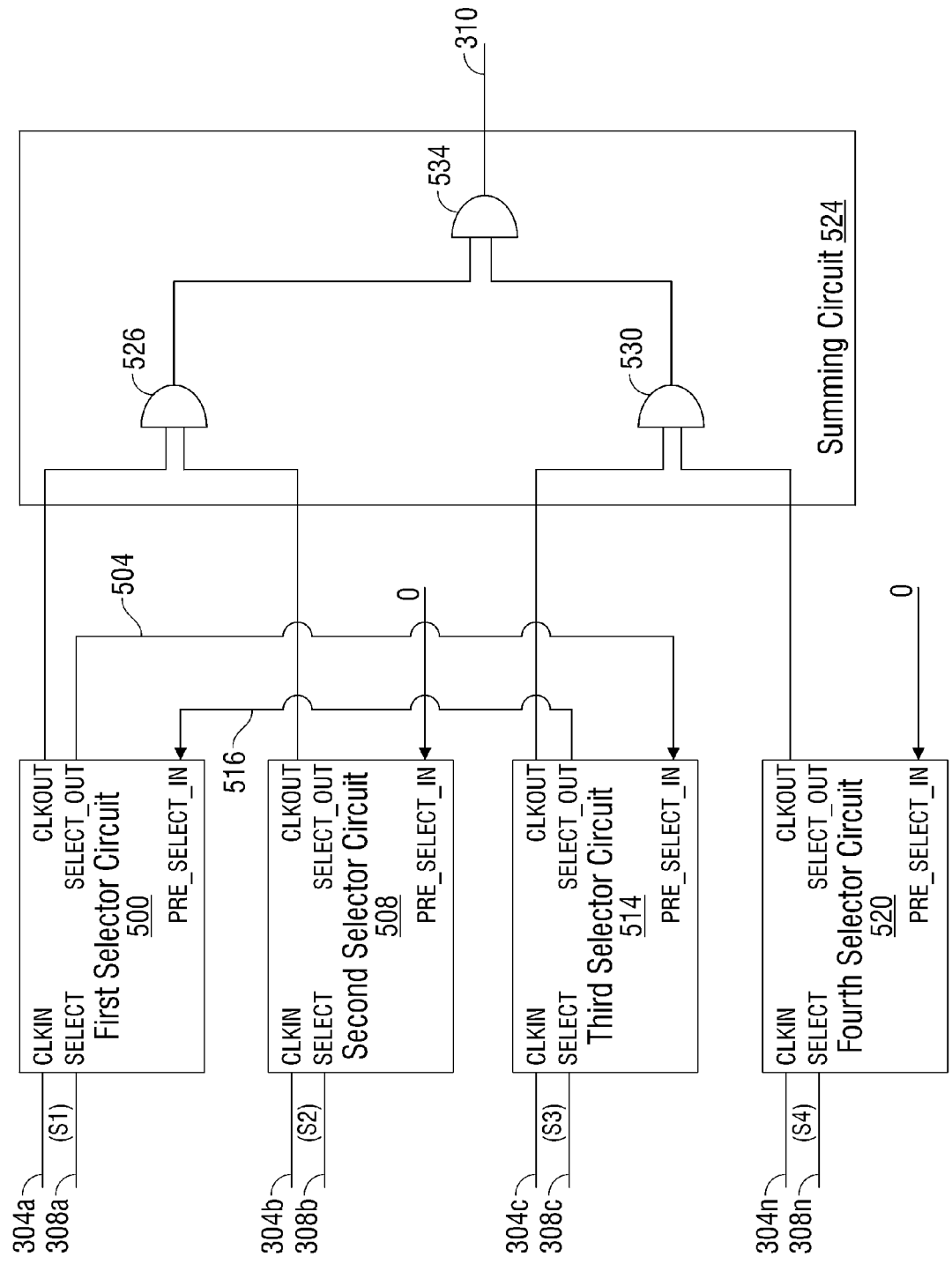
FIG. 12 is a schematic block diagram depicting the glitch-free MUX of FIG. 3, assuming that the second frequency=(first frequency)(N+0.5).

FIG. 12 is a schematic block diagram depicting the glitch-free MUX 306 of FIG. 3, assuming that the second frequency=(first frequency)(N+0.5).

Figure 13:
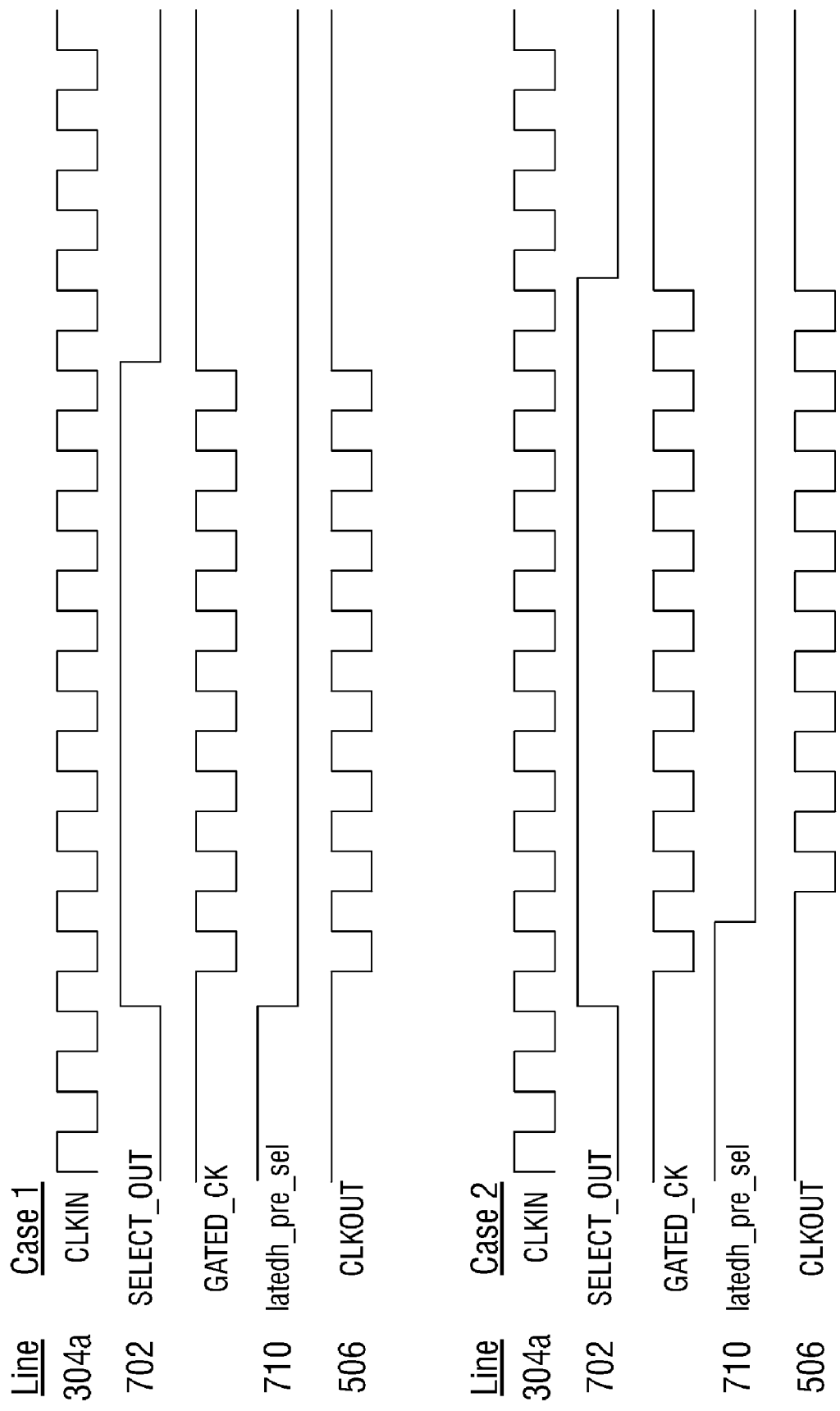
FIG. 13 is a timing diagram associated with the selector circuit of FIG. 7.

FIG. 13 is a timing diagram associated with the selector circuit of FIG. 7. Two scenarios are depicted, with the difference being in the timing of the latedh_pre_sel signal, which occurs as a result of differences in the PRE_SELECT_IN signal. In both cases, the selector circuit does not output the CLKOUT signal until the latedh_pre_sel signal toggles low. That is, the selector circuit does not output the CLKOUT signal until final pulse of the previously enabled selector circuit toggles low.

Figure 14:
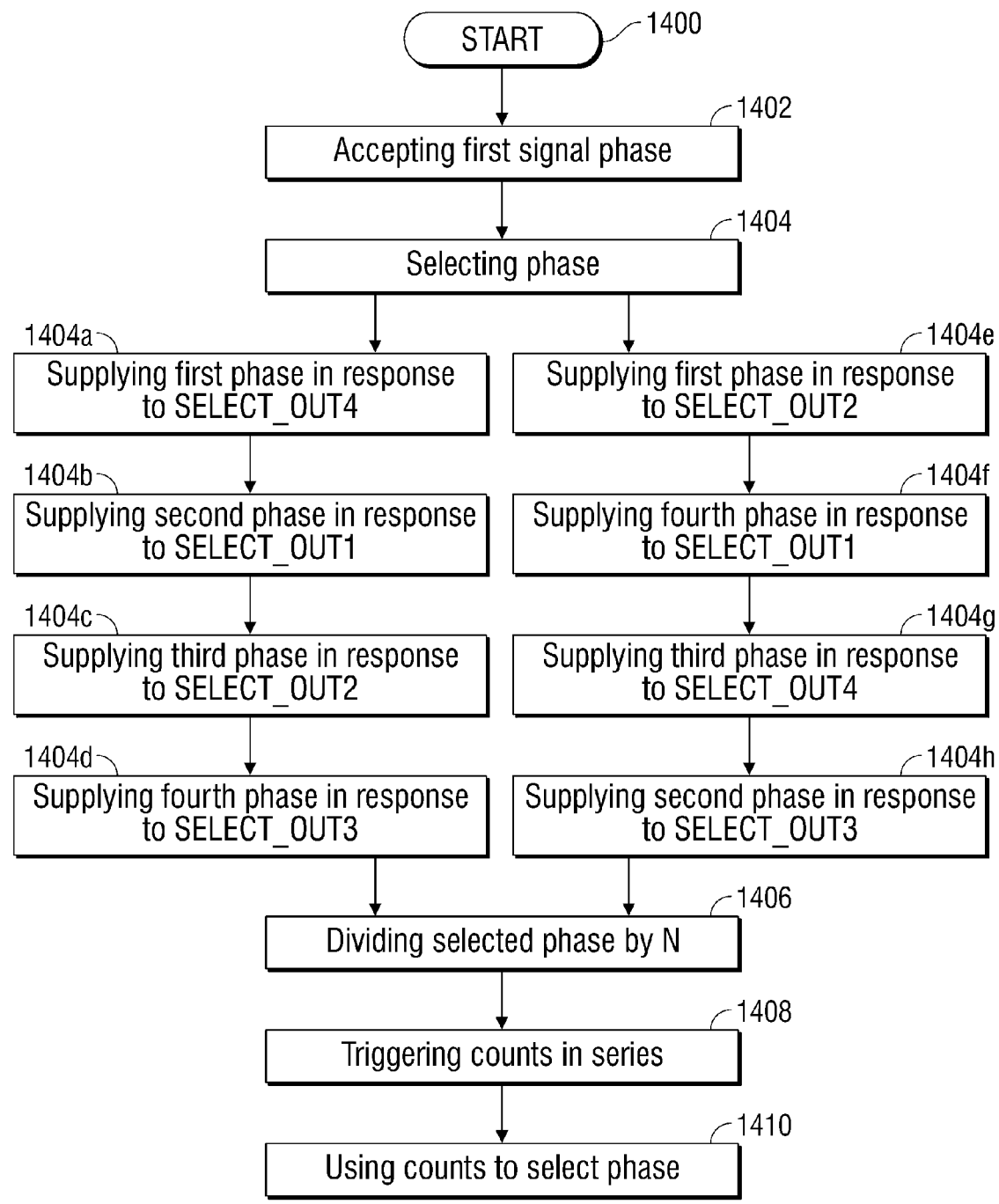
FIG. 14 is a flowchart illustrating a method for jitter-free fractional division.
Figure 15:
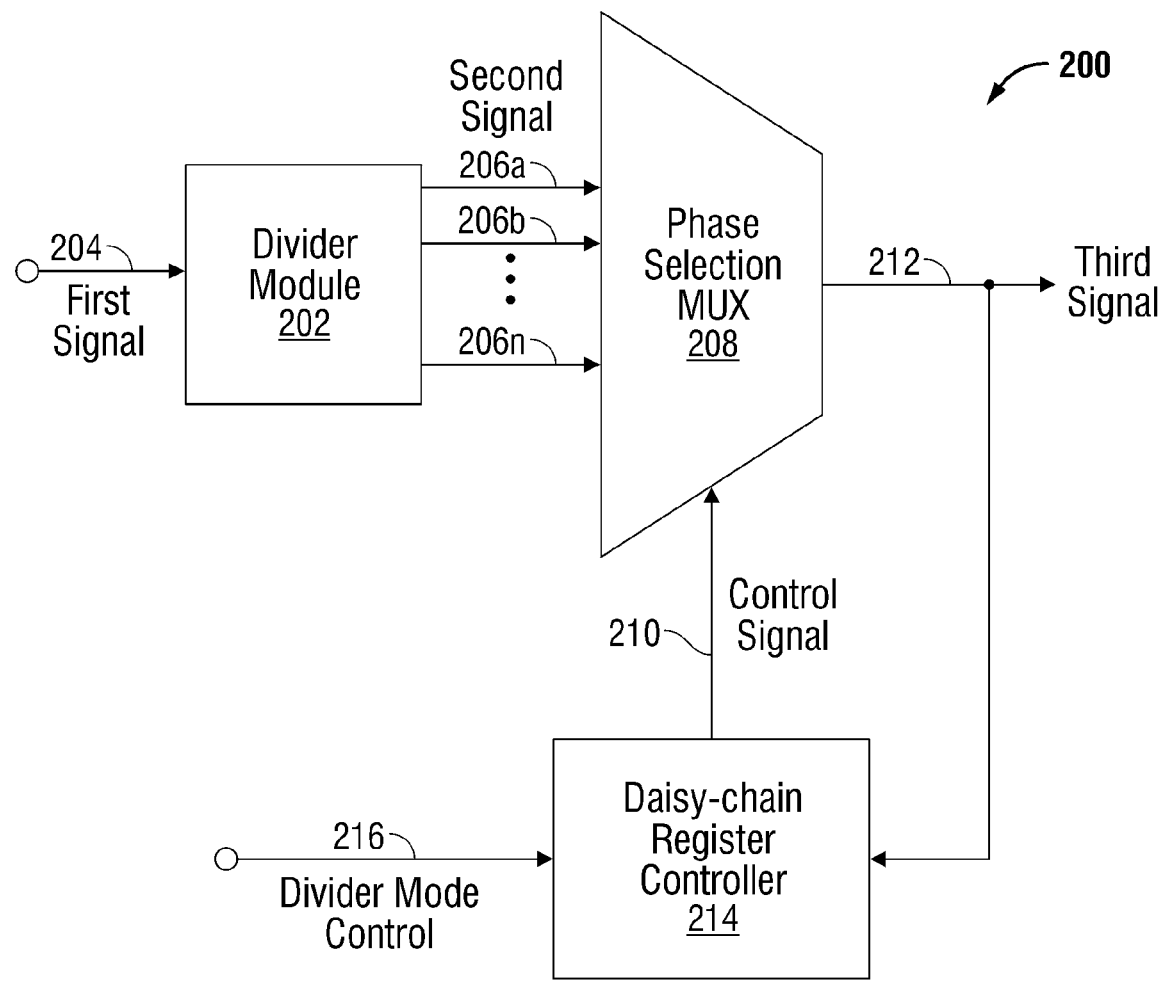
FIG. 15 depicts a drawing from pending parent application entitled, HIGH SPEED MULTI-MODULUS PRESCALAR DIVIDER, invented by An et al., Ser. No. 11/717,261, filed Mar. 13, 2007.

FIG. 14 is a flowchart illustrating a method for jitter-free fractional division. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1400.

Step 1402 accepts a first plurality of first signal phases, each phase having a first frequency. Step 1404 selects a phase subsequent to deselecting a previous phase selection. Step 1406 divides the selected phase by the integer N, supplying a second signal with a second frequency. Using the second signal as a clock, Step 1408 triggers a first plurality of counts in series. Step 1410 uses each count to select a corresponding phase.

In one example, accepting the first plurality of first signal phases in Step 1402 includes accepting a first signal with 4 phases, each phase separated from a neighboring phase by 90 degrees. Continuing the example, series triggering the first plurality of counts in Step 1408 includes using a first count to trigger a second count, using the second count to trigger a third count, using the third count to trigger a fourth count, and using the fourth count to trigger the first count. Then, using each count to select the corresponding phase in Step 1410 includes using the first count to select a first phase, using the second count to select a second phase, using the third count to select a third phase, and using the fourth count to select a fourth phase. For example, the second frequency supplied in Step 1406 may be equal to (the first frequency)(N+0.25), (the first frequency)(N+0.5), or (the first frequency)(N+0.75).

In one example, selecting the phase subsequent to deselecting the previous phase selection in Step 1404 includes the following substeps. Step 1404a supplies a first phase signal (CLKOUT1) in response to accepting a first count trigger (SELECT1) and a permission signal (SELECT_OUT4), and supplies a permission signal (SELECT_OUT1) in response to losing the first count trigger. Step 1404b supplies a second phase signal (CLKOUT2) in response to accepting a second count trigger (SELECT2) and a permission signal (SELECT_OUT1, and supplies a permission signal (SELECT_OUT2) in response to losing the second count trigger. Step 1404c supplies a third phase signal (CLKOUT3) in response to accepting a third count trigger (SELECT3) and a permission signal (SELECT_OUT2, and supplies a permission signal (SELECT_OUT3) in response to losing the third count trigger. Step 1404d supplies a fourth phase signal (CLKOUT4) in response to accepting a fourth count trigger (SELECT4) and a permission signal (SELECT_OUT3, and supplies a permission signal (SELECT_OUT4) in response to losing the fourth count trigger. In this example, supplying the second signal with the second frequency in Step 1406 includes supplying a second frequency=(first frequency)(N+0.25).

In another example, selecting the phase subsequent to deselecting the previous phase selection in Step 1404 includes alternate substeps. Step 1404e supplies a first phase signal (CLKOUT1) in response to accepting a first count trigger (SELECT1) and a permission signal (SELECT_OUT2, and supplies a permission signal (SELECT_OUT1) in response to losing the first count trigger. Step 1404f supplies a fourth phase signal (CLKOUT4) in response to accepting a fourth count trigger (SELECT4) and a permission signal (SELECT_OUT1, and supplies a permission signal (SELECT_OUT4) in response to losing the fourth count trigger. Step 1404g supplies a third phase signal (CLKOUT3) in response to accepting a third count trigger (SELECT3) and a permission signal (SELECT_OUT4, and supplies a permission signal (SELECT_OUT3) in response to losing the third count trigger. Step 1404h supplies a second phase signal (CLKOUT2) in response to accepting a second count trigger (SELECT2) and a permission signal (SELECT_OUT3, and supplies a permission signal (SELECT_OUT2) in response to losing the second count trigger. In this example, supplying the second signal with the second frequency in Step 1406 includes supplying a second frequency=(first frequency)(N+0.75).

A system and method for jitter-free fractional division has been presented. Examples of particular division ratios and phase spacings have been given to illustrate the invention. However, the invention is not limited to just these examples. Examples using four phases (n=4) have been presented, but the invention is not limited to any particular value of n. Other variations and embodiments of the invention will occur to those skilled in the art.

We claim:

1. A method for jitter-free fractional division, the method comprising:
  accepting a first plurality of first signal phases, each phase having a first frequency, where the first plurality is equal to 4 and each phase is separated from a neighboring phase by 90 degrees;
  selecting a phase subsequent to deselecting a previous phase selection;
  dividing the selected phase by the integer N, supplying a second signal with a second frequency;
  using the second signal as a clock, triggering a first plurality of counts in series, using a first count to trigger a second count, using the second count to trigger a third count, using the third count to trigger a fourth count, and using the fourth count to trigger the first count; and,
  using each count to select a corresponding phase.

2. The method of claim 1 wherein using each count to select the corresponding phase includes using the first count to select a first phase, using the second count to select a second phase, using the third count to select a third phase, and using the fourth count to select a fourth phase.

3. The method of claim 2 wherein supplying the second signal with the second frequency includes supplying a second frequency selected from a group consisting of (first frequency)(N+0.25), (first frequency)(N+0.5), and (first frequency)(N+0.75).

4. The method of claim 2 wherein selecting the phase subsequent to deselecting the previous phase selection includes:
  supplying a first phase signal (CLKOUT1) in response to accepting a first count trigger (SELECT1) and a permission signal (SELECT_OUT4), and supplying a permission signal (SELECT_OUT1) in response to losing the first count trigger;
  supplying a second phase signal (CLKOUT2) in response to accepting a second count trigger (SELECT2) and a permission signal (SELECT_OUT1), and supplying a permission signal (SELECT_OUT2) in response to losing the second count trigger;
  supplying a third phase signal (CLKOUT3) in response to accepting a third count trigger (SELECT3) and a permission signal (SELECT_OUT2), and supplying a permission signal (SELECT_OUT3) in response to losing the third count trigger;
  supplying a fourth phase signal (CLKOUT4) in response to accepting a fourth count trigger (SELECT4) and a permission signal (SELECT_OUT3), and supplying a permission signal (SELECT_OUT4) in response to losing the fourth count trigger; and,
  wherein supplying the second signal with the second frequency includes supplying a second frequency=(first frequency)(N+0.25).

5. The method of claim 2 wherein selecting the phase subsequent to deselecting the previous phase selection includes:
  supplying a first phase signal (CLKOUT1) in response to accepting a first count trigger (SELECT1) and a permission signal (SELECT_OUT2), and supplying a permission signal (SELECT_OUT1) in response to losing the first count trigger;
  supplying a fourth phase signal (CLKOUT4) in response to accepting a fourth count trigger (SELECT4) and a permission signal (SELECT_OUT1), and supplying a permission signal (SELECT_OUT4) in response to losing the fourth count trigger;
  supplying a third phase signal (CLKOUT3) in response to accepting a third count trigger (SELECT3) and a permission signal (SELECT_OUT4), and supplying a permission signal (SELECT_OUT3) in response to losing the third count trigger;
  supplying a second phase signal (CLKOUT2) in response to accepting a second count trigger (SELECT2) and a permission signal (SELECT_OUT3), and supplying a permission signal (SELECT_OUT2) in response to losing the second count trigger; and,
wherein supplying the second signal with the second frequency includes supplying a second frequency=(first frequency)(N+0.75).

6. A system for jitter-free fractional division, the system comprising:
a clock having an output to supply a first plurality of first signal phase signals, each phase signal having a first frequency, where neighboring phase by 90 degrees;
a glitch-free multiplexer (MUX) having an input to accept the first plurality of phase signals, a control input to accept a first plurality of phase selection signals, and an output to supply a selected phase signal subsequent to deselecting a previous phase selection;
a divider having an input to accept the selected phase signal, the divider dividing the selected phase signal by the integer N, and supplying a second signal with a second frequency at an output; and,
a counter circuit including a first plurality of serially-connected counters, each counter having a clock input to accept the second signal and an output to supply a count as an input to a subsequent counter and as a corresponding phase selection signal to the glitch-free MUX, the counter circuit including:
a first counter having a signal input, a clock input to accept the second signal, and a first count output triggered in response to the combination of signal and clock inputs;
a second counter having a signal input, a clock input to accept the second signal, and a second count output triggered in response to the combination of signal and clock inputs;
a third counter having a signal input, a clock input to accept the second signal, and a third count output triggered in response to the combination of signal and clock inputs; and,
a fourth counter having a signal input, a clock input to accept the second signal, and a fourth count output, triggered in response to the combination of signal and clock inputs.

7. The system of claim 6 wherein the divider supplies a second frequency selected from a group consisting of (first frequency)(N+0.25), (first frequency)(N+0.5), and (first frequency)(N+0.75).

8. The system of claim 6 wherein the divider supplies a second frequency=(first frequency)(N+0.25);
wherein the glitch-free MUX includes:
a first selector circuit having an input to accept a first phase signal (CLKIN1), an input to accept a first phase selection signal (SELECT1), an input to accept a SELECT_OUT4 signal, an output to supply a SELECT_OUT1 signal in response to a last occurrence of a first phase signal (CLKOUT1), and an output to supply the first phase signal in response to accepting the SELECT_OUT4 signal;
a second selector circuit having an input to accept a second phase signal (CLKIN2), an input to accept a second count phase selection signal (SELECT2), an input to accept the SELECT_OUT1 signal (PRE_SELECT_IN2), an output to supply a SELECT_OUT2 signal in response to the last occurrence of a second phase signal (CLKOUT2), and an output to supply the second phase signal in response to accepting the SELECT_OUT1 signal;
a third selector circuit having an input to accept a third phase signal (CLKIN3), an input to accept a third count phase selection signal (SELECT3), an input to accept the SELECT_OUT2 signal (PRE_SELECT_IN3), an output to supply a SELECT_OUT3 signal in response to last occurrence of a third phase signal (CLKOUT3), and an output to supply the third phase signal in response to accepting the SELECT_OUT2 signal;
a fourth selector circuit having an input to accept a fourth phase signal (CLKIN4), an input to accept a fourth count phase selection signal (SELECT4), an input to accept the SELECT_OUT3 signal (PRE_SELECT_IN4), an output to supply the SELECT_OUT4 signal in response to the last occurrence of a fourth phase signal (CLKOUT4), and an output to supply the fourth phase signal in response to accepting the SELECT_OUT3 signal;
wherein the first selector circuit ceases to supply the first phase signal prior to the second selector circuit beginning to supply the second phase signal;
wherein the second selector circuit ceases to supply the second phase signal prior to the third selector circuit beginning to supply the third phase signal;
wherein the third selector circuit ceases to supply the third phase signal prior to the fourth selector circuit beginning to supply the fourth phase signal; and,
wherein the fourth selector circuit ceases to supply the fourth phase signal prior to the first selector circuit beginning to supply the first phase signal.

9. The system of claim 6 wherein the divider supplies a second frequency=(first frequency)(N+0.75);
wherein the glitch-free MUX includes:
a first selector circuit having an input to accept a first phase signal (CLKIN1), an input to accept a first phase selection signal (SELECT1), an input to accept a SELECT_OUT2 signal, an output to supply a SELECT_OUT1 signal in response to the last occurrence of a first phase signal (CLKOUT1), and an output to supply the first phase signal in response to accepting the SELECT_OUT2 signal;
a fourth selector circuit having an input to accept a fourth phase signal (CLKIN4), an input to accept a fourth count phase selection signal (SELECT4), an input to accept the SELECT_OUT1 signal (PRE_SELECT_IN4), an output to supply the SELECT_OUT4 signal in response to the last occurrence of a fourth phase signal (CLKOUT4), and an output to supply the fourth phase signal in response to accepting the SELECT_OUT1 signal;
a third selector circuit having an input to accept a third phase signal (CLKIN3), an input to accept a third count phase selection signal (SELECT3), an input to accept the SELECT_OUT4 signal (PRE_SELECT_IN3), an output to supply a SELECT_OUT3 signal in response to the last occurrence of a third phase signal (CLKOUT3), and an output to supply the third phase signal in response to accepting the SELECT_OUT4 signal;
a second selector circuit having an input to accept a second phase signal (CLKIN2), an input to accept a second count phase selection signal (SELECT2), an input to accept the SELECT_OUT3 signal (PRE_SELECT_IN2), an output to supply a SELECT_OUT2 signal in response to the last occurrence of a second phase signal (CLKOUT2), and an output to supply the second phase signal in response to accepting the SELECT_OUT3 signal;
wherein the first selector circuit ceases to supply the first phase signal prior to the fourth selector circuit beginning to supply the fourth phase signal;

wherein the fourth selector circuit ceases to supply the fourth phase signal prior to the third selector circuit beginning to supply the third phase signal;

wherein the third selector circuit ceases to supply the third phase signal prior to the second selector circuit beginning to supply the second phase signal; and, wherein the second selector circuit ceases to supply the second phase signal prior to the first selector circuit beginning to supply the first phase signal.

10. The system of claim 9 further comprising:
a summing circuit including:
- a first NAND gate having inputs to accept the first and second phase signals and an output to supply a first NAND signal;
- a second NAND gate having inputs to accept the third and fourth phase signals and an output to supply a second NAND signal;
- a third NAND gate having inputs to accept the first and second NAND signals and an output to supply the selected phase signal.

11. The system of claim 6 wherein the glitch-free MUX comprises a plurality of selector circuits, each selector circuit including:
- a flip-flop (FF) having a signal input to accept a SELECT signal, a clock input to accept a CLKIN signal, and an output to supply a SELECT_OUT signal;
- a latch having an input (PRE_SELECT_IN) to accept a SELECT_OUT signal from another selector circuit, a clock input to accept the CLKIN signal, and an output to supply a latch signal; and,
- a gate having an input to accept the SELECT_OUT signal from the FF, an input to accept the CLKIN signal, an input to accept the latch signal, and an output to supply the CLKOUT signal in response to the combination of the SELECT_OUT, CLKIN, and latch signals.

12. A system for jitter-free fractional division, the system comprising:
- a clock having an output to supply a first plurality of first signal phase signals, each phase signal having a first frequency;
- a glitch-free multiplexer (MUX) having an input to accept the first plurality of phase signals, a control input to accept a first plurality of phase selection signals, and an output to supply a selected phase signal subsequent to deselecting a previous phase selection;
- a divider having an input to accept the selected phase signal, the divider dividing the selected phase signal by the integer N, and supplying a second signal with a second frequency at an output;
- a counter circuit including a first plurality of serially-connected counters, each counter having a clock input to accept the second signal and an output to supply a count as an input to a subsequent counter and as a corresponding phase selection signal to the glitch-free MUX;
wherein the glitch-free MUX comprises a plurality of selector circuits, each selector circuit including:
- a flip-flop (FF) having a signal input to accept a SELECT signal, a clock input to accept a CLKIN signal, and an output to supply a SELECT_OUT signal;
- a latch having an input (PRE_SELECT_IN) to accept a SELECT_OUT signal from another selector circuit, a clock input to accept the CLKIN signal, and an output to supply a latch signal; and,
- a gate having an input to accept the SELECT_OUT signal from the FF, an input to accept the CLKIN signal, an input to accept the latch signal, and an output to supply the CLKOUT signal in response to the combination of the SELECT_OUT, CLKIN, and latch signals.

\* \* \* \* \*

UNITED STATES PATENT AND TRADEMARK OFFICE
CERTIFICATE OF CORRECTION

PATENT NO. : 7,813,466 B2
APPLICATION NO. : 12/405905
DATED : October 12, 2010
INVENTOR(S) : Yu Huang et al.

It is certified that error appears in the above-identified patent and that said Letters Patent is hereby corrected as shown below:

In claim 6, column 9, line 10, the following phase --the first plurality is equal to 4 and each phase is separated from a-- should be inserted after the word "where" and before the word "neighboring".

Claim 6 should be printed as follows:

6. A system for jitter-free fractional division, the system comprising:
a clock having an output to supply a first plurality of first signal phase signals, each phase signal having a first frequency, where the first plurality is equal to 4 and each phase is separated from a neighboring phase by 90 degrees;
a glitch-free multiplexer (MUX) having an input to accept the first plurality of phase signals, a control input to accept a first plurality of phase selection signals, and an output to supply a selected phase signal subsequent to deselecting a previous phase selection;
a divider having an input to accept the selected phase signal, the divider dividing the selected phase signal by the integer N, and supplying a second signal with a second frequency at an output; and,
a counter circuit including a first plurality of serially-connected counters, each counter having a clock input to accept the second signal and an output to supply a count as an input to a subsequent counter and as a corresponding phase selection signal to the glitch-free MUX, the counter circuit including:
a first counter having a signal input, a clock input to accept the second signal, and a first count output triggered in response to the combination of signal and clock inputs;
a second counter having a signal input, a clock input to accept the second signal, and a second count output triggered in response to the combination of signal and clock inputs;
a third counter having a signal input, a clock input to accept the second signal, and a third count output triggered in response to the combination of signal and clock inputs; and,
a fourth counter having a signal input, a clock input to accept the second signal, and a fourth count output, triggered in response to the combination of signal and clock inputs.

Signed and Sealed this

Thirtieth Day of November, 2010

David J. Kappos
*Director of the United States Patent and Trademark Office*